United States Patent [19]
Cho

[11] Patent Number: 5,713,717
[45] Date of Patent: Feb. 3, 1998

[54] MULTI-SUBSTRATE FEEDER FOR SEMICONDUCTOR DEVICE MANUFACTURING SYSTEM

[75] Inventor: Gyung Su Cho, Bubaleub, Rep. of Korea

[73] Assignee: Hyundai Electronics Industries Co., Ltd., Kyoungkido, Rep. of Korea

[21] Appl. No.: 493,569

[22] Filed: Jun. 22, 1995

[30] Foreign Application Priority Data

Jun. 23, 1994 [KR] Rep. of Korea ............... 1994-14496

[51] Int. Cl.⁶ .................................................. B25J 18/04
[52] U.S. Cl. ............................................ 414/744.5
[58] Field of Search .................. 414/744.5, 744.4, 414/744.1; 74/490.08, 490.09

[56] References Cited

U.S. PATENT DOCUMENTS 5,151,008   9/1992   Ishida et al. ............... 414/744.5

*Primary Examiner*—Donald W. Underwood
*Attorney, Agent, or Firm*—Merchant, Gould, Smith, Edell, Welter & Schmidt, P.A.

[57] ABSTRACT

A multi-substrate feeder used in a semiconductor device manufacturing system is disclosed. The multi-substrate feeder precisely feeds a plurality of substrates to desired positions at the same time. The multi-substrate feeder has an arm support plate having a cylindrical rotor in the center thereof. A plurality of substrate feeding arms are movably placed on the arm support plate to feed a plurality of substrates at the same time. Each substrate feeding arm is mounted to the edge of the rotor at one end thereof and used for holding a substrate on the other end thereof. The feeder also has arm guide means for guiding the movement of the substrate feeding arms on the arm support plate to guide the substrate feeding direction of the feeder.

4 Claims, 5 Drawing Sheets

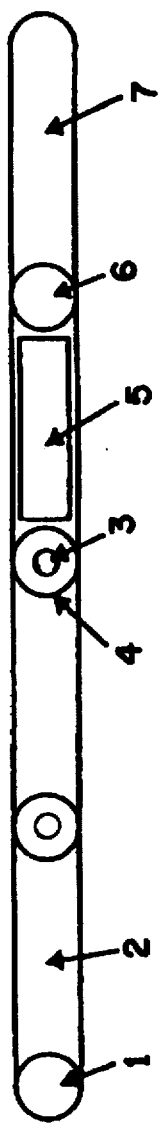
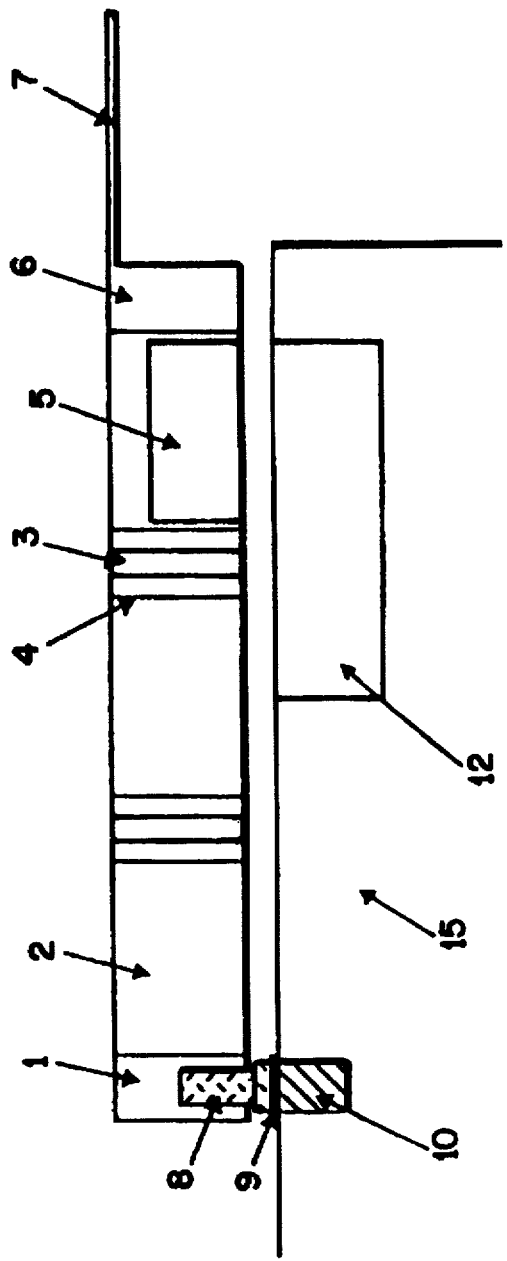

MULTI-SUBSTRATE FEEDER FOR SEMICONDUCTOR DEVICE MANUFACTURING SYSTEM

BACKGROUND OF THE INVENTION

1. Field of the Invention

The present invention relates in general to substrate feeders used in various processing devices of a semiconductor device manufacturing system and, more particularly, to a multi-substrate feeder for precisely feeding a plurality of substrates called wafers to desired positions in a processing device of the system at the same time.

2. Description of the prior Art

Typically, semiconductor devices are manufactured through several tens of dependent processes. Each of the dependent processes for manufacturing the semiconductor devices uses an individual processing device different from the other processing devices used in the other processes.

Each processing device for manufacturing the semiconductor devices is provided with a substrate feeder for feeding the substrates called the wafers in each processing device.

With reference to FIG. 1, there is shown a processing device having a typical substrate feeder. The processing device includes a loader 100 for loading or unloading the wafers. The device also includes a substrate feeding module 200 which feeds the wafers to four process modules A, B, C and D. The module 200 has a substrate feeding arm.

In the above processing device, the substrate feeding arm of the module 200 will feed the wafers from the loader 100 to the process modules A, B, C and D, from the process modules A, B, C and D to the loader 100 or from one of the process modules to another process module.

However, the above module 200 has no means for precisely guiding the movement of the substrate feeding arm when the arm moves linearly so as to load or unload a wafer relative to one of the process modules or when the arm rotates to feed a wafer from one of the process module to another process module. In this regard, the above substrate feeder having the module 200 has a problem in that an operational error may be caused in the wafer feeding operation.

Furthermore, the module 200 merely has one or two substrate feeding arms so that the module 200 only feeds one or two wafers at a time. As the module 200 merely feeds simultaneously two wafers at the maximum, the processing device with the module 200 has a low processing velocity. Therefore, the above processing device can not help achieving low productivity of the semiconductor devices.

SUMMARY OF THE INVENTION

It is, therefore, an object of the present invention to provide a multi-substrate feeder used in a semiconductor device manufacturing system in which the above problems can be overcome and which precisely feeds a plurality of substrates, commonly referred to as the wafers, to desired positions at the same time.

In order to accomplish the above object, the present invention provides a multi-substrate feeder for a semiconductor device manufacturing system comprising: an arm support plate having a cylindrical rotor in the center thereof; a plurality of substrate feeding arms movably placed on the arm support plate and adapted for feeding a plurality of substrates at the same time, each substrate feeding arm being mounted to the edge of the rotor at one end thereof and holding a substrate on the other end thereof; and arm guide means for guiding the movement of the substrate feeding arms on the arm support plate to guide the substrate feeding direction of the feeder.

BRIEF DESCRIPTION OF THE DRAWINGS

The above and other objects, features and other advantages of the present invention will be more clearly understood from the following detailed description taken in conjunction with the accompanying drawings, in which:

FIG. 4 is a plan view of the substrate feeding arm of FIG. 2 in the extended position;

FIG. 5 is a side view showing a part of an arm support plate and the substrate feeding arm of FIG. 2 in the fully extended position;

DESCRIPTION OF THE PREFERRED EMBODIMENTS

Figure 1:
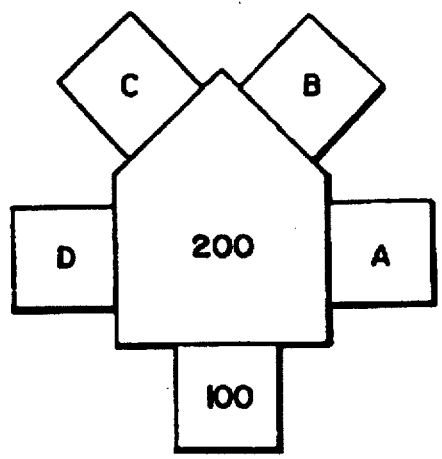
FIG. 1 is a schematic view of a processing device of a semiconductor device manufacturing system having a typical substrate feeder.
Figure 2:
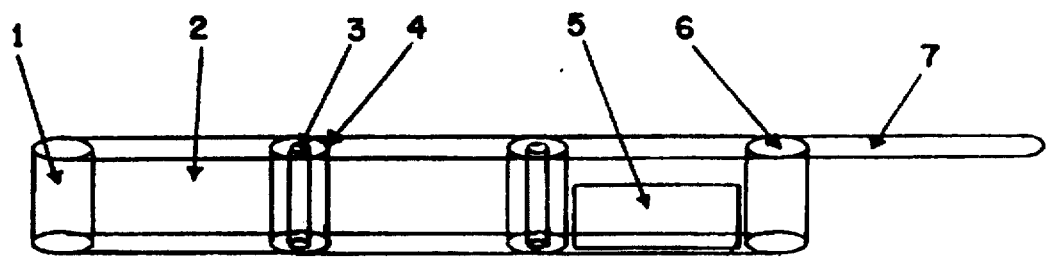
FIG. 2 is a perspective view of a substrate feeding arm of a multi-substrate feeder in accordance with a primary embodiment of the present invention, showing the arm in the fully extended position.

FIG. 2 is a perspective view of a substrate feeding arm of a multi-substrate feeder in accordance with a primary embodiment of the present invention. In this drawing, the arm is in the fully extended position. The extended position of the arm is for feeding a substrate from or to either a process module or a load lock. The above load lock means an inlet for taking the substrate in or out of a processing device of a semiconductor device manufacturing system.

Figure 3:
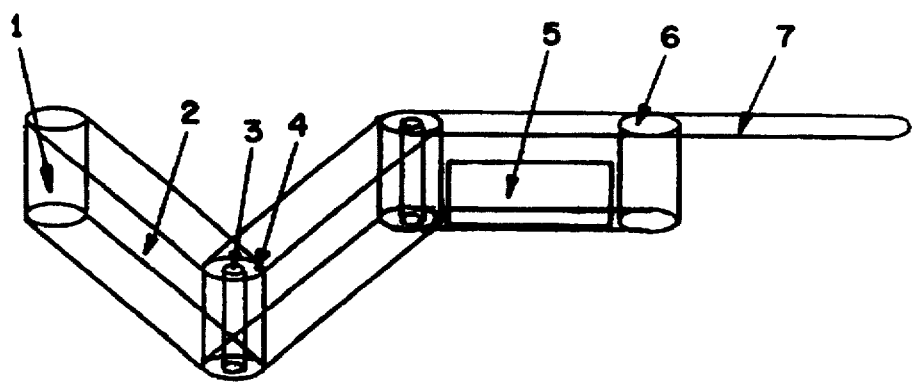
FIG. 3 is a view corresponding to FIG. 2, but showing the arm in the retracted position.

FIG. 3 is a perspective view of the above substrate feeding arm in the retracted position. The retracted position of the arm is for taking the substrate in or out of a given module.

As shown in the above drawings, the substrate feeding arm includes a cylindrical drive center roller 1. The above roller 1, which is provided in one end of the arm, is fixed to the edge of a rotor. The rotor, which will be described in detail later herein, is provided on the top surface of an arm support plate. A substrate loader panel 7 is provided on the other end of the arm. The loader panel 7 is held by a cylindrical loader holder 6. The drive center roller 1 is connected to the loader holder 6 by means of a roller connection panel 2. The substrate feeding arm also includes a plurality of free rollers 3 and 4 which are placed between the center roller 1 and the loader holder 6. With the free rollers 3 and 4, the roller connection panel 2 can be bent about the rollers 3 and 4 for linearly driving the loader holder 6 in the direction toward the rotor having the center roller 1.

In FIGS. 2 and 3, the reference numeral 5 denotes a first magnet which is provided in the arm and used as arm guide means.

The operational effect of the above substrate feeding arm will be described hereinbelow with reference to FIGS. 4 and 5.

FIG. 4 is a plan view of the substrate feeding arm in the extended position and FIG. 5 is a side view showing a part of the arm support plate and the arm in the extended position.

As shown in FIGS. 4 and 5, the substrate feeding arm is applied with the rotating force of a motor 8 coupled to the center roller 1 so that the arm can be extended or retracted on the arm support plate. In order to let the substrate feeding arm be bent, the plurality of free rollers 3 and 4 are placed between the center roller 1 and the loader holder 6 as described above.

To achieve straightness of the arm when the arm is extended and retracted, a pair of magnets 5 and 12 as the arm guide means are used in the substrate feeder of this invention. That is, the first magnet 5 is provided in the arm, while the second magnet 12 is provided in the top surface of the arm support plate 15. The above magnets 5 and 12 operate in accordance with theory of a typical electromagnet or permanent magnet. That is, if one of the magnets 5 and 12 has the south pole, the other magnet has the north pole so that the magnets 5 and 12 keep a given gap therebetween as well as their predetermined directivities. Due to the above magnets 5 and 12, the substrate feeding arm can be kept in the desired direction with a given angle and directivity when the arm is extended or retracted on the arm support plate 15 to feed the substrate.

In the substrate feeder according to the primary embodiment, there may be a vacuum difference between the arm and the top surface of the arm support plate 15. In order to prevent undesirable mixing of the two different vacuum states, a vacuum sealing plate 9 is placed between the substrate feeding arm and the top surface of the arm support plate 15 as shown in FIG. 5. The above substrate feeder further includes an encoder 10 which controls the rightward and leftward rotation of the arm.

Figure 6:
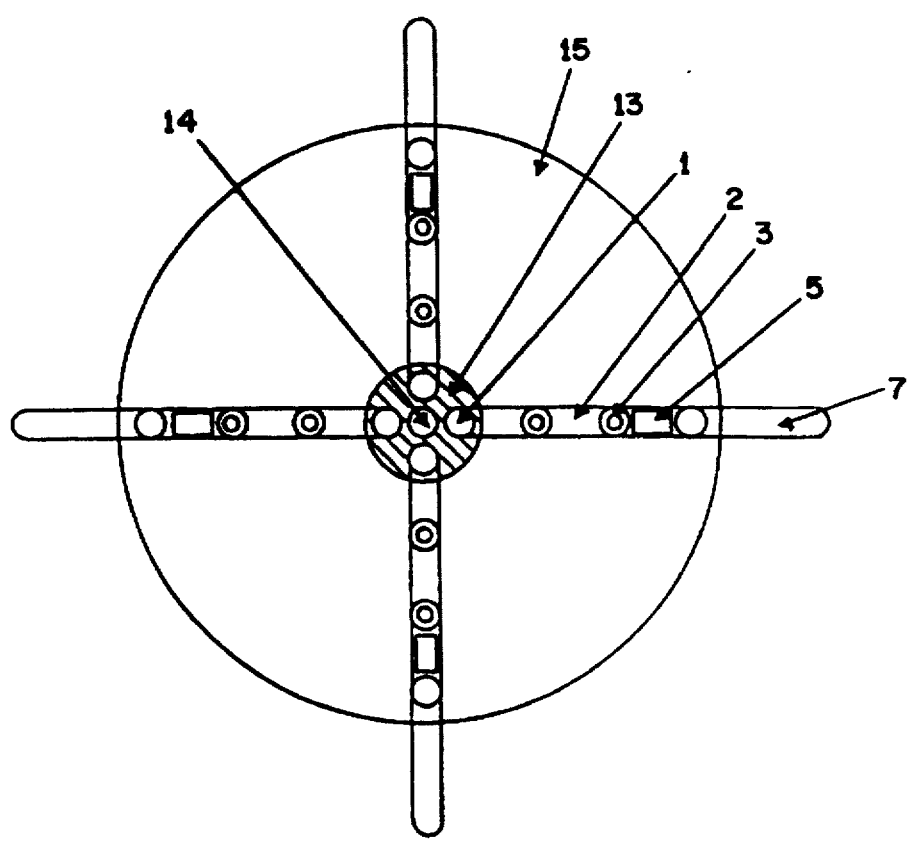
FIG. 6 is a plan view of the substrate feeder having four substrate feeding arms of FIG. 2 in the fully extended position.
Figure 7:
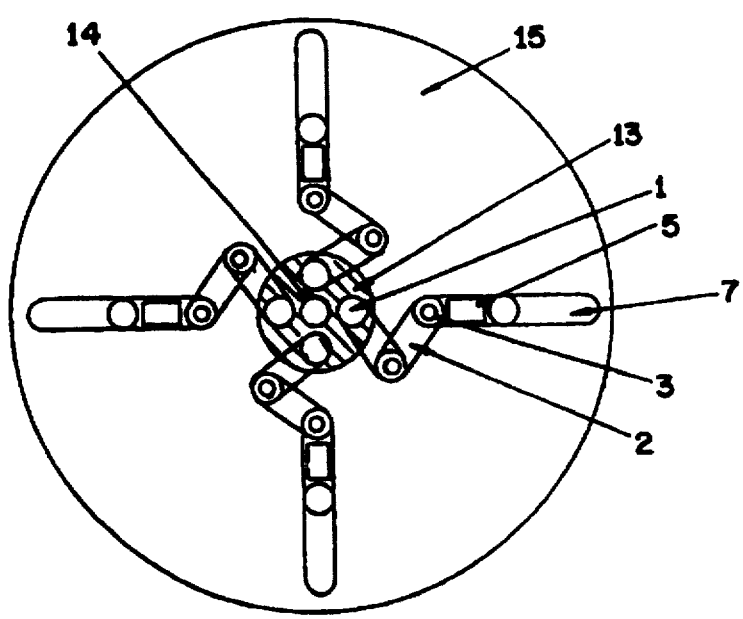
FIG. 7 is a view corresponding to FIG. 6, but showing the arms in the retracted position.

Turning to FIGS. 6 and 7, there is shown the substrate feeder having four substrate feeding arms in accordance with the primary embodiment of the invention. This substrate feeder can be preferably used in a processing device having three process modules along with one load lock.

As shown in FIGS. 6 and 7, the four arms can be simultaneously extended or retracted on the arm support plate 15 so that the above substrate feeder can improve the processing velocity of the processing device. Of course, please note that each arm is forced to extend or retract as a result of the rotating force of individual motor 8. However, the motor 8 is not shown in FIGS. 6 and 7.

The clockwise and counterclockwise rotation of the arms is achieved by the rotor 13 provided in the center of the top surface of the arm support plate 15. That is, rotation of a stator motor 14 placed in the center of the rotor 13 causes the rotor 13 to be rotated and thereby rotating the arms as a unit either clockwise or counterclockwise. In this state, the drive center rollers 1 of the arms provided about the rotor 13 are driven by motors 8 to extend and retract the arms and to feed the substrates. The extension and retraction of the arms in this case is controlled by the encoder 10 of FIG. 5.

Figure 8:
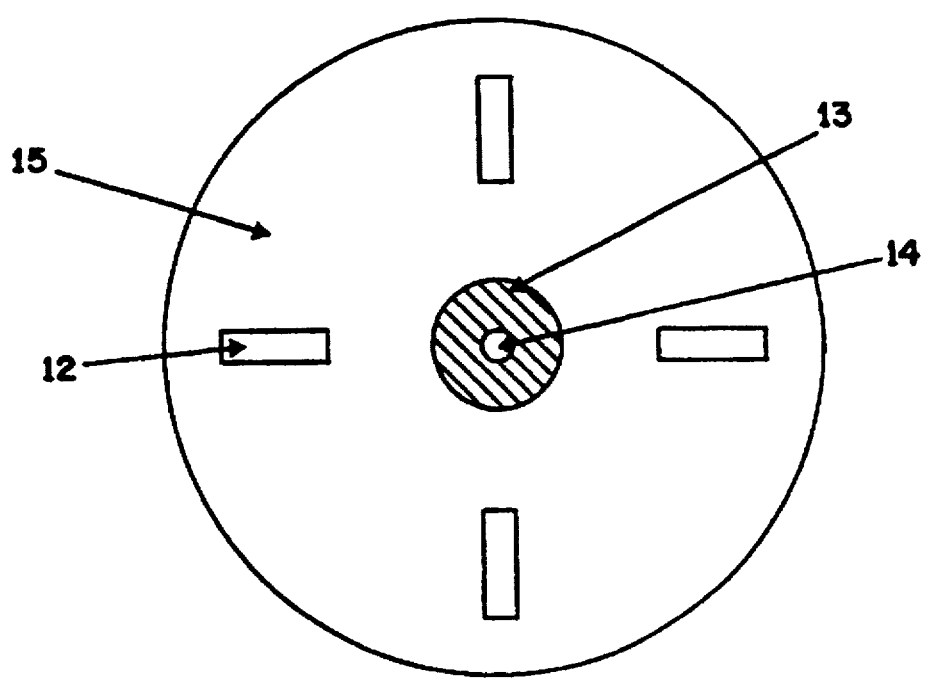
FIG. 8 is a plan view of an arm support plate of the substrate feeder, showing magnets used as arm guide means in accordance with the primary embodiment of the invention.

FIG. 8 is a plan view showing the position of the second magnets 12 provided on the top surface of the arm support plate 15. The second magnets 12 are placed in the linear moving passages of the arms. Each second magnet 12 and an associated first magnet 5 operate in accordance with theory of the electromagnet or permanent magnet as described above. Each arm thus keeps its predetermined directivity when it is extended or retracted on the arm support plate to feed the substrate.

Figure 9:
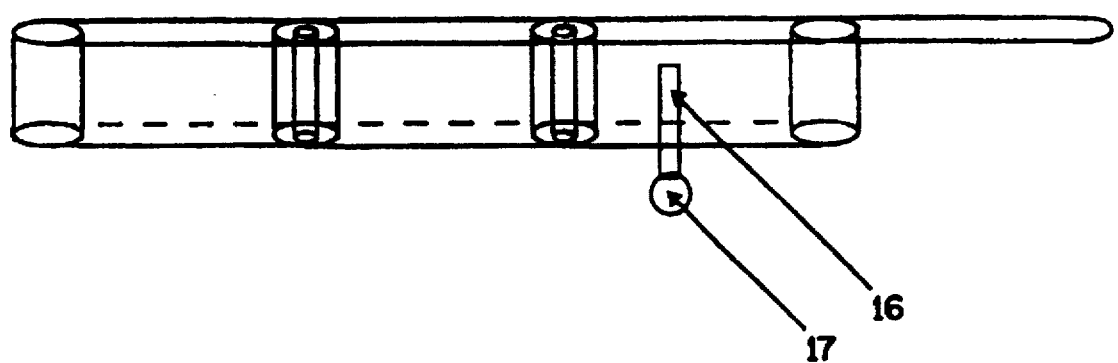
FIG. 9 is a perspective view of a substrate feeding arm in accordance with a second embodiment of the present invention.
Figure 10:
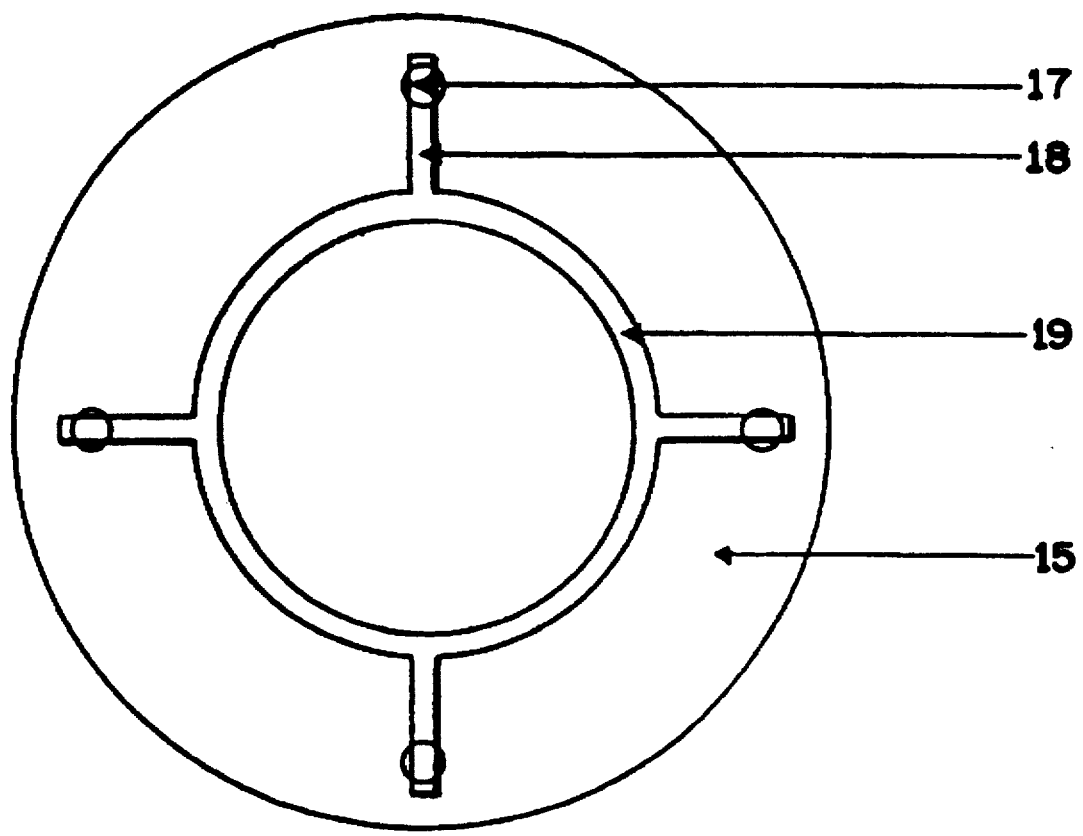
FIG. 10 is a plan view of an arm support plate of the substrate feeder, showing radial grooves and a circular groove used as arm guide means in accordance with the second embodiment of the invention.

Turning to FIGS. 9 and 10, there is shown a substrate feeder in accordance with a second embodiment of the invention.

FIG. 9 is a perspective view showing a substrate feeding arm of the substrate feeder in the fully extended position. In this second embodiment, the arm guide means comprises a guide rod which is provided in the substrate feeding arm. The guide rod has a bearing holder 16 and a bearing 17.

The bearing 17 is coupled to the bottom end of the holder 16 such that the bearing 17 is smoothly rotated when the arm moves on the arm support plate.

FIG. 10 is a plan view of an arm support plate according to the second embodiment, showing the arm guide means formed on the top surface of the arm support plate. As shown in this drawing, the top surface of the arm support plate 15 is provided with radial guide grooves 18 and a circular guide groove 19. The above radial grooves 18 are formed on the linear moving passages of the substrate feeding arms respectively, while the circular groove is formed on the rotating passage of the arms.

When the substrate feeding arms of the second embodiment are assembled with the arm support plate, the bearing 17 of each arm engages with the guide grooves 18 and 19 of the arm support plate 15 such that each arm can move or rotate on the arm support plate 15.

In the substrate feeder of the primary embodiment, the arm guide means comprises the first magnet provided in each substrate feeding arm and the second magnet provided in the top surface of the arm support plate. The first and second magnets have the opposite poles. With the above first and second magnets, each substrate feeding arm of the substrate feeder can keep the predetermined directivity when the arm moves on the arm support plate to feed the substrate.

In the substrate feeder in accordance with the second embodiment of the invention, the arm guide means comprises a guide rod provided in each substrate feeding arm and two types of guide grooves formed on the top surface of the arm support plate. With the guide rod and the guide grooves, each substrate feeding arm of the substrate feeder can keep the predetermined directivity when the arm moves on the arm support plate to feed the substrate.

Of course, it should be understood that the substrate feeder of this invention may be provided with five or more substrate feeding arms.

As described above, the present invention provides a multi-substrate feeder which precisely feeds a plurality of substrates called wafers to desired positions in a processing device of a semiconductor device manufacturing system at the same time. The substrate feeder of this invention thus improves productivity of the semiconductor devices and reduces the number of the substrate feeders used in the system, thus to cut down the cost. Another advantage of this multi-substrate feeder is resided in that the substrate feeding arms are precisely guided by arm guide means when the arms move or rotate on the arm support plate to feed the substrates, thus to prevent operational error in the substrate feeding operation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A multi-substrate feeder for a semiconductor device manufacturing system comprising:

an arm support plate having a cylindrical rotor in the center thereof;

a plurality of substrate feeding arms and motors movably placed on the arm support plate and adapted for feeding a plurality of substrates at the same time, said motors being mounted to said rotor, each substrate feeding arm being mounted to one of said motors at a first end thereof and holding a substrate on a second end thereof, each of said substrate feeding arms including a loader panel to hold said substrate at the second end; and arm guide means for guiding the movement of the substrate feeding arms on the arm support plate to guide the substrate feeding direction of the feeder.

2. The multi-substrate feeder according to claim 1, wherein said substrate feeding arm comprises:

a drive center roller provided at the first end of said arm and mounted to the one of said motors;

a substrate loader panel provided on the second end of said arm and adapted for loading the substrate, said loader holder being adapted for holding said loader panel;

a roller connection panel extending between the drive center roller and the loader holder to connect the drive center roller to the loader holder; and said roller connection panel including a plurality of free rollers provided between the drive center roller and the loader and adapted for allowing said roller connection panel to be bent thereabout to linearly drive the loader holder in a direction toward said rotor.

3. The multi-substrate feeder according to claim 1, wherein said arm guide means comprises:

a first magnet provided in each substrate feeding arm; and a second magnet provided on the top surface of the arm support plate, said first and second magnets having the opposite poles.

4. The multi-substrate feeder according to claim 1, wherein said arm guide means comprises:

a plurality of guide grooves formed along substrate feeding passages on the top surface of said arm support plate; and a guide rod provided in each substrate feeding arm, said guide rod engaging with an associated guide groove to move along the guide groove.

* * * * *